US008312405B1

(12) United States Patent
Slonim et al.

(10) Patent No.: US 8,312,405 B1
(45) Date of Patent: Nov. 13, 2012

(54) METHOD OF PLACING INPUT/OUTPUT BLOCKS ON AN INTEGRATED CIRCUIT DEVICE

(75) Inventors: Victor Slonim, Broomfield, CO (US); Rajat Aggarwal, Los Altos, CA (US); Guenter Stenz, Longmont, CO (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 433 days.

(21) Appl. No.: 12/356,349

(22) Filed: Jan. 20, 2009

(51) Int. Cl.
*G06F 17/50* (2006.01)
(52) U.S. Cl. .................. 716/116; 716/119; 716/121
(58) Field of Classification Search .................. 716/116
See application file for complete search history.

(56) References Cited

U.S. PATENT DOCUMENTS

| | | | |
|---|---|---|---|
| 6,289,496 B1 * | 9/2001 | Anderson et al. ............. | 716/116 |
| 6,417,689 B1 | 7/2002 | Jain | |
| 6,877,140 B1 * | 4/2005 | Perry ........................... | 716/104 |
| 7,299,439 B1 | 11/2007 | Slonim et al. | |
| 7,392,499 B1 | 6/2008 | Stenz et al. | |
| 7,882,484 B1 * | 2/2011 | Baldwin et al. ............... | 716/115 |

OTHER PUBLICATIONS

Xiong, Jinjun; Wong, Yiu-Chung; Sarto, Egino; He, Lei; "Constraint Driven I/O Planning and Placement for Chip-package Co-design," Jan. 24, 2006, IEEE.*
Mak, Wai-Kei, "Modern FPGA Constrained Placement," Jan. 18, 2005, IEEE.*
U.S. Appl. No. 12/184,108, filed Jul. 31, 2008, Slonim et al.
Kirkpatrick, S. et al., "Optimization by Simulated Annealing," *Science*, May 13, 1983, pp. 671-680, vol. 220, No. 4598.

\* cited by examiner

*Primary Examiner* — Vuthe Siek
*Assistant Examiner* — Eric Lee
(74) *Attorney, Agent, or Firm* — John J. King

(57) ABSTRACT

A method of placing input/output blocks on an integrated circuit device is described. The method may comprise receiving a circuit design having a plurality of input/output blocks to be placed at input/output sites of the integrated circuit device; modifying, for each input/output block of the circuit design, an input/output standard for the input/output block to include bus information; assigning, for each input/output block of the circuit design, an input/output site for the input/output block; and generating an input/output placement for the input/output blocks of the circuit design. A computer product is also disclosed.

20 Claims, 6 Drawing Sheets

US 8,312,405 B1

METHOD OF PLACING INPUT/OUTPUT BLOCKS ON AN INTEGRATED CIRCUIT DEVICE

FIELD OF THE INVENTION

The present invention relates generally to integrated circuit devices, and in particular, to a method of placing input/output (I/O) blocks on an integrated circuit device.

BACKGROUND OF THE INVENTION

Integrated circuit devices are an integral part of any electronic device. Integrated circuits typically have many I/O sites for receiving data from or providing data to a circuit board of the electronic device. Placement of I/O blocks of a circuit design for an integrated circuit device provides significant challenges to circuit designers. For example, I/O blocks of a circuit design may have different I/O standards. Further, many I/O blocks of a circuit design are part of a bus. Accordingly, the placement of I/O blocks may not only affect routing within the integrated circuit device, but may also affect routing on a printed circuit board receiving the integrated circuit device.

SUMMARY OF THE INVENTION

A method of placing input/output blocks on an integrated circuit device is described. The method may comprise receiving a circuit design having a plurality of input/output blocks to be placed at input/output sites of the integrated circuit device; modifying, for each input/output block of the circuit design, an input/output standard for the input/output block to include bus information; assigning, for each input/output block of the circuit design, an input/output site for the input/output block; and generating an input/output placement for the input/output blocks of the circuit design.

According to an alternate embodiment, a method of placing input/output blocks on an integrated circuit device. The method comprises receiving a circuit design having a plurality of input/output blocks to be placed at input/output sites of the integrated circuit device; modifying, for each input/output block of the circuit design, an input/output standard for the input/output block to include bus information; creating input/output groups based upon the modified input/output standards for the plurality of input/output blocks; minimizing, for each input/output group, the number of input/output banks having input/output blocks for the input/output group; and generating an input/output placement for the input/output blocks of the circuit design.

A computer program product is also disclosed. The computer program may comprise a computer-readable medium comprising computer-readable program code that assigns a plurality of input/output blocks to input/output sites of an integrated circuit device, the computer-readable medium comprising: computer-readable program code that receives a circuit design having a plurality of input/output blocks to be placed at input/output sites of the integrated circuit device; computer-readable program code that modifies, for each input/output block of the circuit design, an input/output standard for the input/output block to include bus information; computer-readable program code that assigns, for each input/output block of the circuit design, an input/output site for the input/output block; and computer-readable program code that generates an input/output placement for the input/output blocks of the circuit design.

DETAILED DESCRIPTION

Figure 1:
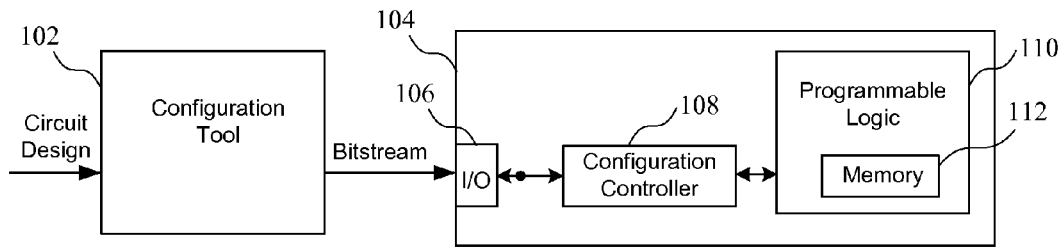
FIG. 1 is a block diagram of a system for configuring I/O sites of an integrated circuit device according to an embodiment of the present invention.
Figure 2:
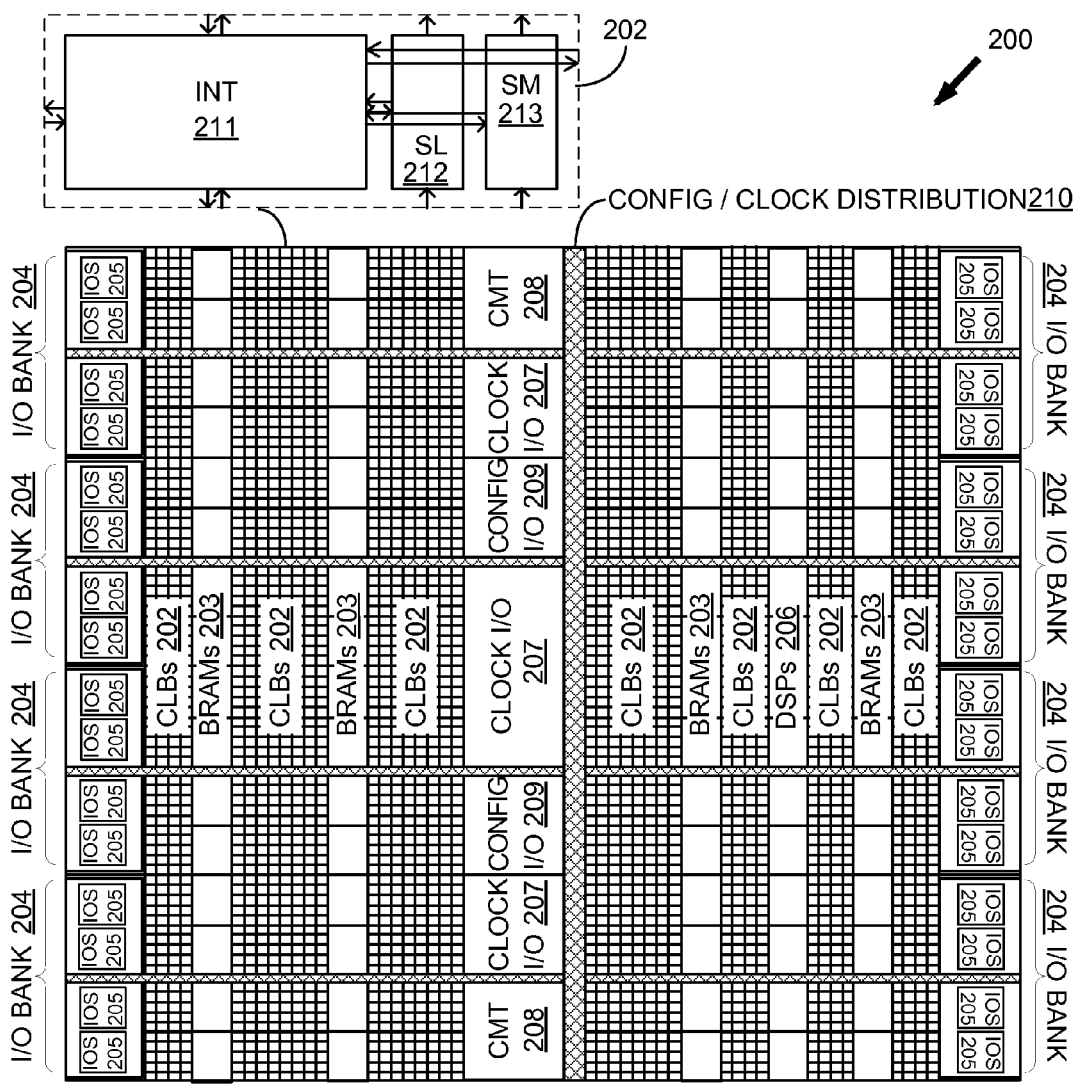
FIG. 2 is a block diagram of an integrated circuit device having I/O sites according to an embodiment of the present invention.

Turning first to FIG. 1, a block diagram of a system for configuring I/O sites of an integrated circuit device according to an embodiment of the present invention is shown. In particular, a configuration tool 102 is coupled to receive a circuit design to be implemented in an integrated circuit device, where the circuit design has I/O requirements. The configuration tool, which may comprise a computer running configuration software comprising a placement tool, will generate a layout for an integrated circuit including the placement of I/O blocks for the integrated circuit design. While the description set forth below is provided in reference to a device having programmable logic, the methods may be applied to any type of integrated circuit device for placing I/O blocks for the device. As will be described in more detail in reference to an integrated circuit device having programmable logic as shown in FIG. 2, a configuration bitstream is provided to an integrated circuit device 104 by way of an I/O site 106. The configuration bitstream comprises configuration data and other control data. The configuration bitstream is coupled to a configuration controller 108, the output of which is provided to programmable logic circuit 110 having a memory 112. The programmable logic circuit 110 may comprise a number of programmable logic blocks, each having configuration memory. Although a single programmable logic circuit 110 is shown, it should be understood that the programmable logic circuit 110 may comprise a plurality of programmable logic circuits, as will be shown in more detail in reference to FIGS. 2 and 3.

Turning now to FIG. 2, a block diagram of an integrated circuit device having programmable logic according to an embodiment of the present invention is shown. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to I/O resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 2 comprises an FPGA architecture 200 having a large number of different programmable tiles including configurable logic block sites (CLBs 202), random access memory block sites (BRAMs 203), input/output banks (IOBs 204) comprising input/output sites (IOS 205), digital signal processing sites (DSPs 206), clock I/O sites 207, clock management circuitry (CMT) sites 208, configuration I/O sites 209, and configuration and clock distribution areas 210. The device may include sites for other programmable logic blocks such as digital clock managers, analog-to-digital converters, system monitoring logic, and so forth.

In the FPGA of FIG. 2, an exemplary CLB could include a single programmable interconnect element (INT 211) and two different "slices", slice L (SL 212) and slice M (SM 213). In some embodiments, the two slices are the same (e.g., two copies of slice L, or two copies of slice M). In other embodiments, the two slices have different capabilities. In some embodiments, some CLBs could include two different slices and some CLBs include two similar slices. For example, in some embodiments some CLB columns could include only CLBs with two different slices, while other CLB columns could include only CLBs with two similar slices.

A CLB may include a configurable logic element that may be programmed to implement user logic plus a single programmable interconnect element. Typically, the number of interconnect elements included in a tile depends on the height of the tile. In the pictured embodiment, a BRAM tile would have the same height as five CLBs, but other numbers may also be used. An IOS 205 may also include input/output logic elements in addition to programmable interconnect elements. The location of connections of the device is controlled by configuration data bits of a configuration bitstream provided to the device. The programmable interconnects, in response to bits of a configuration bitstream, enable connections comprising interconnect lines to be used to couple the various signals to the circuits implemented in programmable logic, or other circuits such as BRAMs.

In the pictured embodiment, a columnar area near the center of the die and extending outward from the columnar area (shown cross-hatched in FIG. 2) may be used for configuration, clock, and other control logic. That is, the horizontal areas extending from this column may be used to distribute the clocks and configuration signals across the breadth of the FPGA. Some FPGAs utilizing the architecture illustrated in FIG. 2 include additional logic blocks that disrupt the regular columnar structure making up a large part of the FPGA. For example, a processor block may be employed.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLB sites appear, to facilitate the efficient implementation of user logic. The methods of the present invention may be implemented in the device of FIG. 2, or in any other suitable device or devices, including any type of integrated circuit having programmable logic. When implementing a circuit in a programmable logic device, a configuration tool or tools enable synthesis of the circuit design, packing of elements of the circuit into various blocks, placement of the various blocks, and routing of any required interconnects between the blocks. The methods described in more detail below relate to the beneficial placement of IOBs in an integrated circuit.

Figure 3:
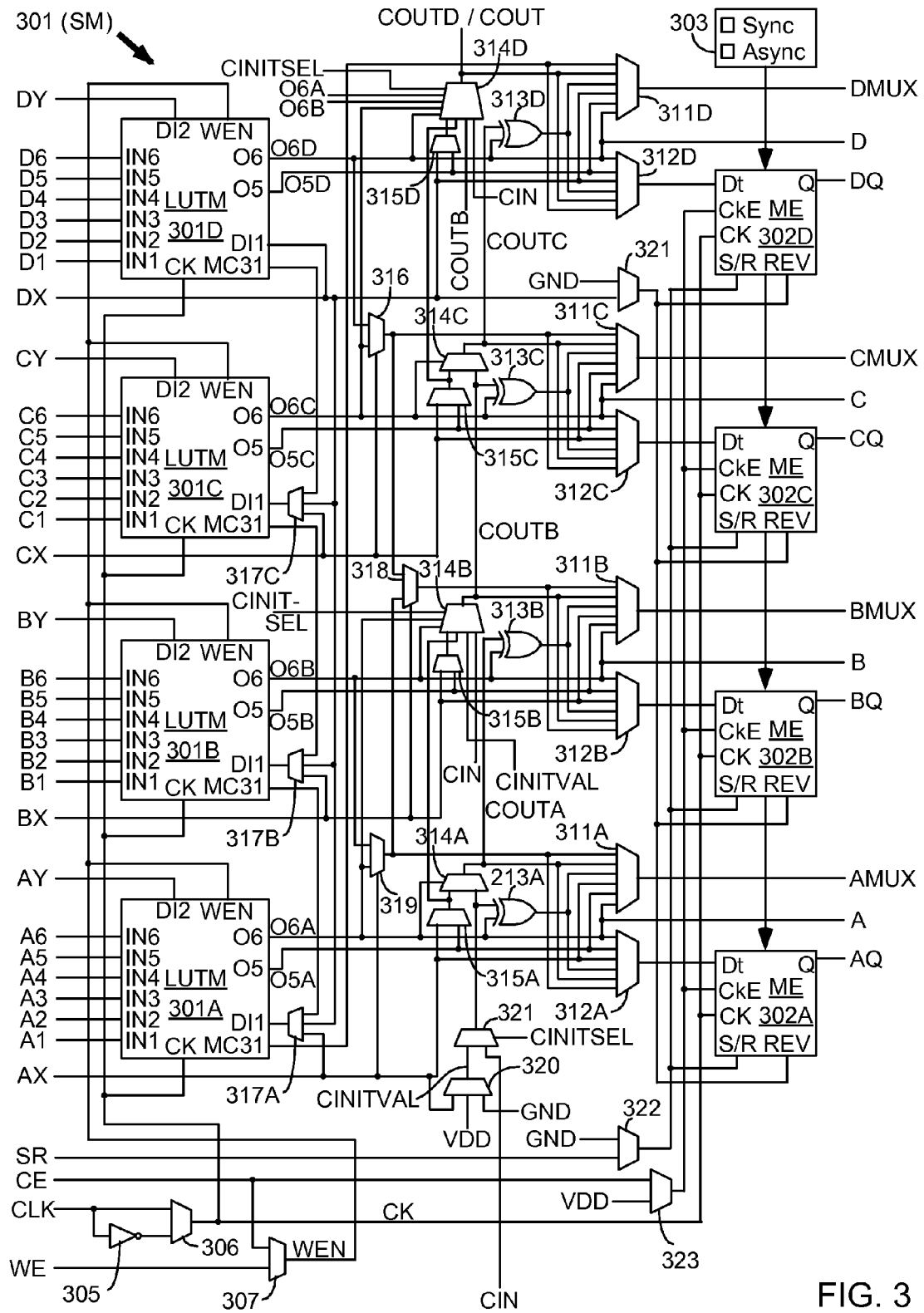
FIG. 3 is a block diagram of a configurable logic block of the device of FIG. 2 according to an embodiment of the present invention.

Turning now to FIG. 3, a block diagram of a configurable logic block of the device of FIG. 2 according to an embodiment of the present invention is shown. In particular, FIG. 3 illustrates in simplified form a configuration logic block which may be implemented in a configurable logic block site of FIG. 2. In the embodiment of FIG. 3, slice M 301 includes four lookup tables (LUTMs) 301A-301D, each driven by six LUT data input terminals A1-A6, B1-B6, C1-06, and D1-D6 and each providing two LUT output signals O5 and O6. The O6 output terminals from LUTs 301A-301D drive slice output terminals A-D, respectively. The LUT data input signals are supplied by the FPGA interconnect structure via input multiplexers, which may be implemented by programmable interconnect element 311, and the LUT output signals are also supplied to the interconnect structure. Slice M also includes: output select multiplexers 311A-311D driving output terminals AMUX-DMUX; multiplexers 312A-312D driving the data input terminals of memory elements 302A-302D; combinational multiplexers 316, 318, and 319; bounce multiplexer circuits 322-323; a circuit represented by inverter 305 and multiplexer 306 (which together provide an optional inversion on the input clock path); and carry logic comprising multiplexers 314A-314D, 315A-315D, 320-321 and exclusive OR gates 313A-313D. All of these elements are coupled together as shown in FIG. 3. Where select inputs are not shown for the multiplexers illustrated in FIG. 3, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 3 for clarity, as well as from other selected figures herein.

In the pictured embodiment, each memory element 302A-302D may be programmed to function as a synchronous or asynchronous flip-flop or latch. The selection between synchronous and asynchronous functionality is made for all four memory elements in a slice by programming Sync/Asynch selection circuit 303. When a memory element is programmed so that the S/R (set/reset) input signal provides a set function, the REV input terminal provides the reset function. When the memory element is programmed so that the S/R input signal provides a reset function, the REV input terminal provides the set function. Memory elements 302A-302D are clocked by a clock signal CK, which may be provided by a global clock network or by the interconnect structure, for example. Such programmable memory elements are well known in the art of FPGA design. Each memory element 302A-302D provides a registered output signal AQ-DQ to the interconnect structure. Because each LUT 301A-301D provides two output signals, O5 and O6, the LUT may be configured to function as two 5-input LUTs with five shared input signals (IN1-IN5), or as one 6-input LUT having input signals IN1-IN6.

In the embodiment of FIG. 3, each LUTM 301A-301D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 317A-317C for LUTs 301A-301C), or to the two 32-bit RAMs via input terminals DI1 and DI2. RAM write operations in the LUT RAMs are controlled by clock signal CK from multiplexer 306 and by write enable signal WEN from multiplexer 307, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 301A may also be provided to the general interconnect structure for shift register chaining, via output select multiplexer 311D and CLE output terminal DMUX. The devices having programmable logic and methods of the present invention may be implemented according to the device of FIGS. 2 and 3, or in any device, including any type of integrated circuit having programmable logic.

Figure 4:
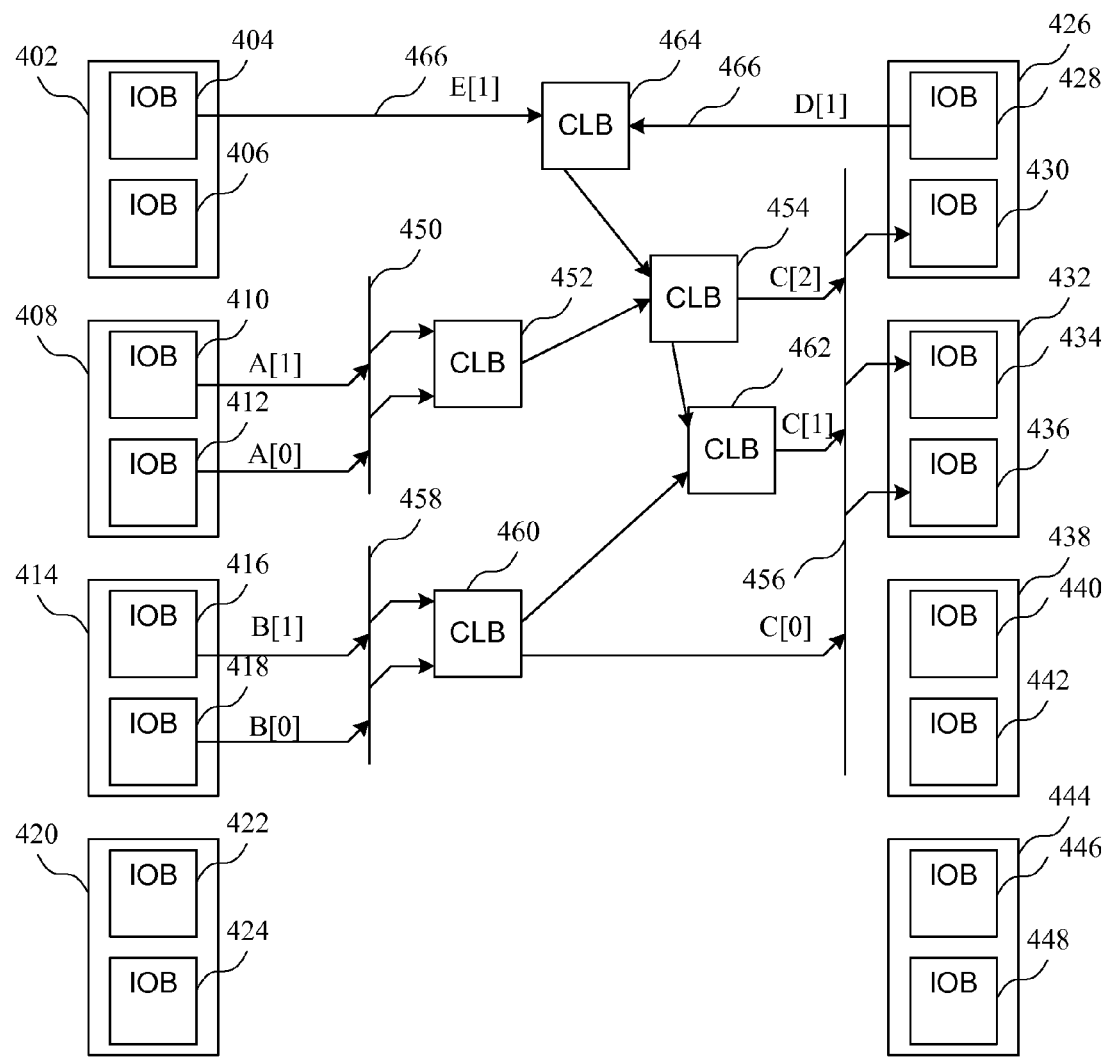
FIG. 4 is a block diagram of I/O banks and configurable logic blocks of an integrated circuit according to an embodiment of the present invention.

Turning now to FIG. 4, a block diagram of I/O banks and configurable logic blocks of an integrated circuit according to an embodiment of the present invention is shown. A number of I/O blocks which may be implemented in the IOB sites 204 and configurable logic blocks which may be implemented in the CLB sites 202 are shown by way of example to describe the various methods of placing I/O blocks of a circuit design on I/O banks of an integrated circuit. Eight I/O banks and corresponding I/O sites 402-448 are shown, where specific I/O blocks implemented in the I/O sites are coupled by way of I/O buses, as will be described in more detail below. The I/O buses of a circuit design may be identified in a synthesized netlist of the design using information from a design specification, such as a Verilog or VHDL specification for the circuit design. Information identifying the buses of the circuit design may be extracted from the specification. Alternatively, the I/O buses may be identified using the names of the I/O blocks in the synthesized netlist of the design, wherein the names for the I/O blocks of I/O buses may be a root name followed by an integer, or another similar naming scheme.

While each I/O site of FIG. 4 may be configured to implement one of a variety of communication protocols, the I/O sites in a particular bank, such as I/O sites 404 and 406 in I/O bank 402, should be programmed to implement compatible communication protocols. It should be noted that a bank is a group of I/O sites, where each bank may have separate power supply pins that determine the voltage levels driven by the I/O sites that are programmed to be an output in the bank, or the threshold level of the I/O sites that are programmed to be an input in the bank. Compatible communication protocols may have the same or similar driving voltage levels and the same or similar receiving threshold levels. It will be appreciated that other rules in addition to compatible voltage levels may determine the compatible communication protocols for the I/O sites of the banks of FIG. 4, as will be described in more detail below.

In particular, IOB 410 and IOB 412 are coupled to a first bus 450 for receiving bits A[0] and A[1] which are coupled to CLB 452. An output of the CLB 452 is coupled to a CLB 454, which generates a bit C[2] coupled to a bus 456. Outputs of IOB 416 and IOB 418 are coupled by way of a bus 458 to a CLB 460. An output comprising bit C[0] of the CLB 460 is coupled to the bus 456, while a second output of CLB 460 is coupled to a CLB 462, the output of which comprises bit C[1]. As can be seen with bus 456, not enough I/O sites are available in I/O bank 432. Therefore, IOS 430 of the adjacent bank 426 is also used for the bus 456. The placement if I/O blocks of a circuit design in a single bank or adjacent banks will be described in more detail below. While the circuit of FIG. 4 shows a limited number on I/O sites and banks for purposes of providing an example, it should be understood that an integrated circuit such as a programmable logic device may contain many more I/O sites and configurable logic blocks. Also, while the I/O blocks are shown on the ends of the device, the I/O blocks may be positioned at any location of the device.

The task of placement in an integrated circuit is to assign a site on the integrated circuit device to each block in the design subject to various optimization objectives and to variety of constraints. The placement task is typically divided into 2 sequential steps including the placement of I/O blocks to sites within I/O banks and the subsequent placement of logic blocks with the fixed I/O blocks. The placement of I/O blocks may often be performed without having detailed information about timing and locations for other elements of the design, providing many challenges in I/O placement. Many integrated circuits may support multiple I/O standards simultaneously, and use a banked I/O organization with specified number of I/O banks. I/O select rules associated with I/O standards for integrated circuits, which address restrictions on the assignment of an I/O block of a circuit design to an I/O site of a bank, are collectively referred to as "banking rules." The capacities of the I/O banks and any banking rules are provided to specify which I/O blocks of a circuit design may be combined in the same I/O bank. Examples of banking rules includes requirements for a reference voltage (VREF), an output voltage (VCCO), a termination type (e.g. split, single, driver, none), and a direction type (e.g. input, output or bidirectional) in an I/O bank. Although these banking rules are given by way of example, the banking rules could include any requirement or feature which may vary between two different I/O standards. Thus, the placement of I/O blocks of a circuit design is subject to the set of constraints imposed by the banking rules, available resource, and various compatibility rules.

It also should be noted that many I/O blocks are part of I/O buses. An I/O bus is a set of I/O blocks of a circuit design that carry the individual bits of a data word. The placement of the I/O blocks from the same I/O bus in bit-order into adjacent I/O sites, and if necessary adjacent banks, has a number of advantages. For example, such a placement simplifies routing of I/O signals on the circuit board having the integrated circuit device, and makes an automatically generated placement look more similar to a manual one and seem more intuitive for system designers. However, such an I/O placement is nonetheless more difficult to perform because of the difficulties in satisfying all banking rules for larger sets of I/O blocks. There are also various optimization objectives, such as wire length minimization or timing optimizations, arising from the user-imposed constraints or from general desire to have high quality I/O placement solution. As is apparent in FIG. 4, both buses 450 and 458 are associated only with a single bank. However, bus 456 is associated with both banks 426 and 432. As will be described in more detail in FIG. 5, the placement of I/O blocks at various I/O sites may be performed to positively impact the layout of the integrated circuit, as well the as the circuit board which receives the integrated circuit, by taking into account both banking rules and the locations of buses.

Figure 5:
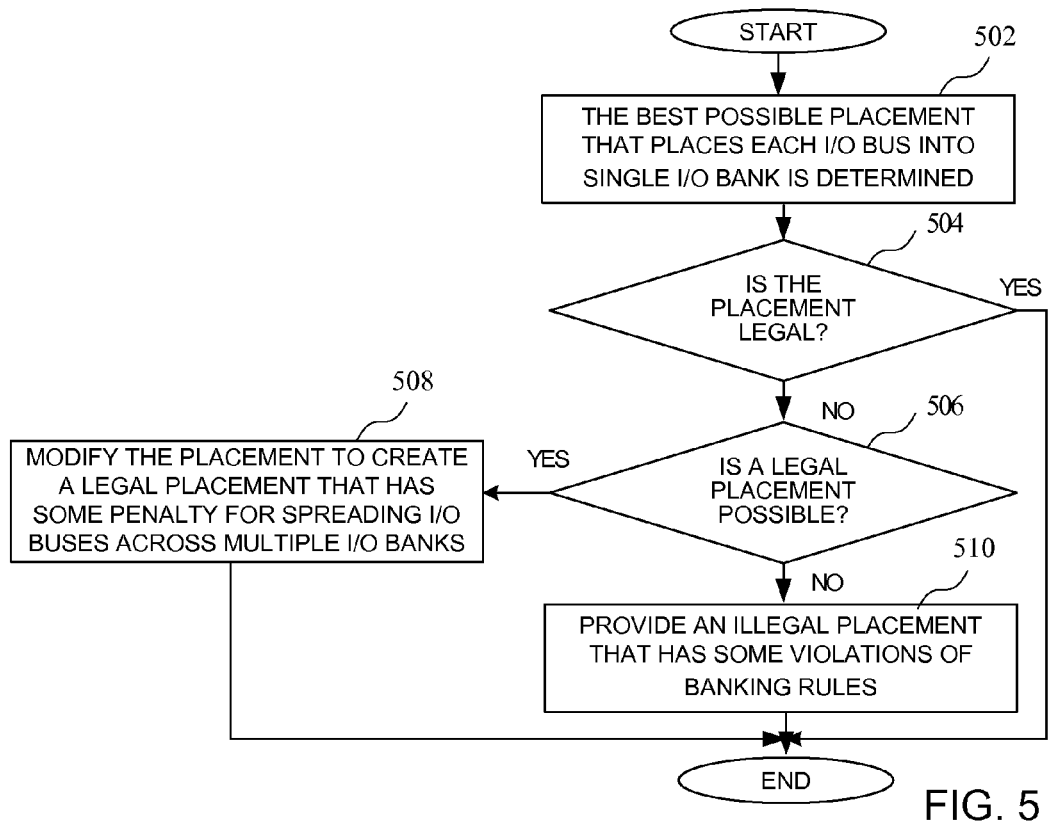
FIG. 5 is a flow chart showing a method of placing I/O blocks according to an embodiment of the present invention.

Turning now to FIG. 5, a flow chart shows generating a placement for I/O blocks according to an embodiment of the present invention. Before describing specific methods set forth in FIGS. 5-8, it should be noted that the methods may be employed in the circuits of FIGS. 1-4 as described, or any other suitable method. The best possible placement that places each I/O bus into single I/O bank is determined at a step 502. Given the sequence of I/O blocks (based on an I/O Bus sequence), the I/O blocks are placed legally into the sequence of I/O sites (based on I/O Bank Sequence) in such a way that all I/O blocks from the same I/O Bus are placed strictly within the same I/O Bank. It is then determined whether the placement is legal at a step 504. If such placement is legal, the placement is accepted. If the placement is not legal, it is determined whether a legal placement is possible at a step 506. If so, the placement is modified to a legal placement that has some penalty for spreading I/O buses across multiple I/O banks at a step 508. That is, a placement is generated without imposing a limitation to restrict all I/O blocks from the same I/O bus strictly within the same I/O Bank. If a legal placement is not possible, an illegal placement having some violations of banking rules is generated at a step 510. That is, a placement is created without imposing a limitation to place all I/O blocks legally. If such placement is not successful, an error message is generated indicating that an I/O placement is impossible.

Figure 6:
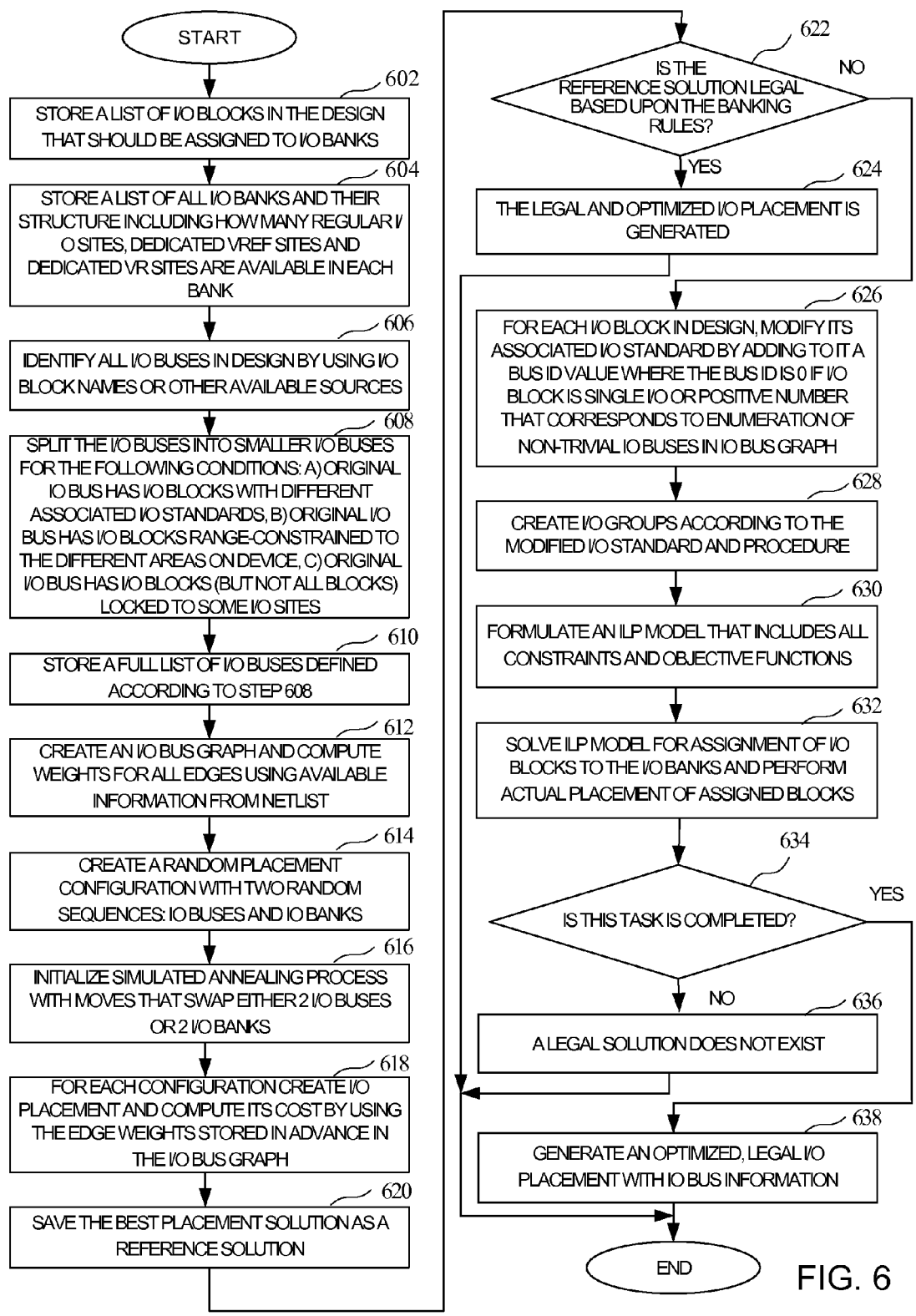
FIG. 6 is a flow chart showing a method of placing I/O blocks on an integrated circuit device according to an alternate embodiment of the present invention.

Turning now to FIG. 6, a flow chart shows a method of placing I/O blocks on an integrated circuit according to an alternate embodiment of the present invention. The placement of I/O blocks in a device is often the first part of a placement task, where the placement of the other blocks in a device is often performed after I/O placement. The placement of I/O blocks may be performed at very early stage when a tool for performing placement, such as configuration tool 102, does not have detailed information about possible locations of core blocks and wire delays. An objective for the I/O placement task is to find an I/O placement solution that obeys all banking rules and that allows the subsequent placement steps of core components to achieve a high quality placement in terms of wire length and timing. Accordingly, the methods of the present invention use bus information with an Integer Linear Programming (ILP) based method to attempt to find a legal feasible solution that satisfies all banking rules in order to satisfy both banking rules and I/O bus constraints, which relate to the constraints associated with a bus when placing an I/O block of a bus in an I/O site. The Integer Linear Programming (ILP) formulation may use proximity optimization to an external reference solution. While an optimized reference solution, which will be discussed in more detail below, may violate banking rules, the reference solution may be used to generate the placed solution. That is, a best possible legal solution may be generated based upon a comparison with the reference solution, where the legal solution is as close as possible to the reference solution. Therefore, by employing an ILP formulation which takes I/O buses into account, a uniform and powerful technique for I/O bus-aware placement of I/O blocks is provided.

Referring specifically to FIG. 6, a list of I/O blocks in the circuit design that should be assigned to I/O banks is stored at a step 602. This assignment need only be performed once for a given design. A list of all I/O banks and their structure, including how many regular I/O sites are available and how many dedicated $V_{ref}$ sites and dedicated $V_r$ sites are available in each bank, is stored at a step 604. The $V_{ref}$ I/O sites supply a reference voltage to the bank and the $V_r$ sites supply a proper termination voltage for DCI standards. This step is also performed only once for a given device, and can be reused for multiple designs. All I/O buses in the design are identified by using I/O block names or other available sources at a step 606. I/O buses of size 1 are created for all individual I/O blocks in a design functioning as a single input or output. Steps for identifying I/O buses in the design are described in more detail in reference to FIG. 7. The I/O buses are then split into smaller I/O buses at a step 608 when following conditions exist: a) an original I/O bus has I/O blocks with different associated I/O standards; b) an original I/O bus has I/O blocks which are range-constrained to the different areas on device, and c) an original I/O bus has some I/O blocks (but not all I/O blocks) locked to some I/O sites. A full list of I/O buses defined according to step 608 is then stored at a step 610. The generation of the full list of I/O buses is performed only once for a given design. An I/O Bus Graph is then created, and weights for all edges are computed using available information from a netlist at a step 612.

A random placement configuration is then created with two random sequences comprising I/O buses and I/O banks at a step 614. A simulated annealing process is initialized, where moves that swap either 2 I/O buses or 2 I/O banks are performed at a step 616. The application of simulated annealing will be described in more detail below. For each configuration generated in step 616, an I/O placement is created and its cost is computed by using edge weights stored in advance in I/O Bus Graph at a step 618. It should be noted that steps for determining I/O placement are described in more detail in reference to FIG. 7, while steps of computing a cost are defined in more detail in reference to FIG. 8. The best placement solution is then saved as a reference solution at a step 620.

It is then determined whether the reference solution is legal based upon the banking rules at a step 622. If so, the legal and optimized I/O placement is generated at a step 624. If not, for each I/O block in the design, its associated I/O standard is modified by adding a bus identification (BusID) value at a step 626, where the BusID is 0 if the I/O block is a single I/O or positive number that corresponds to enumeration of non-trivial I/O buses in the I/O bus graph. In the example of FIG. 4, bus 450 could be designated as having a BusID of 1, bus 458 could be designated as having a BusID of 2, bus 456 could be designated as having a BusID of 3, while buses 466 and 468 would each be designated with a BusID of 0. I/O groups are then created according to the modified I/O standard at a step 628. An ILP model that includes all constraints and objective functions is formulated at a step 630. The ILP model for the assignment of I/O blocks of the design to the I/O banks is solved and actual placement of assigned blocks to I/O sites is performed at a step 632. It is then determined whether this task is completed at a step 634. If so, an optimized, legal I/O placement is generated with I/O bus information at a step 638. If not, it is determined that a legal solution does not exist and the process is ended.

In performing the steps 626-632, I/O bus placement extension is based on a method of assigning I/O blocks to I/O banks subject to various banking rules. This extension of the I/O standard definition to include I/O bus information including both a bus name and an order of I/O blocks to be placed according to an I/O bus definition results in the creation of new I/O groups. A new I/O group would represent a set of I/O blocks that belong to the same I/O bus and share the same range constraints and other banking rule attributes. Including the I/O bus information in an ILP objective function prevents some I/O blocks from being spread to multiple I/O banks, and enables the I/O blocks to be placed in an order specified by the I/O bus definition. The use of I/O bus information also allows proximity optimization to a reference solution modified to include I/O bus information and to keep corresponding I/O blocks together in adjacent I/O sites. Accordingly, a legal placement is generated where the legal placement takes I/O bus information into account and is optimized toward the reference solution.

In particular, each I/O block is associated with some I/O standard, Si, as described above. According to an embodiment of the present invention, a BusID is added to conventional attributes or restrictions defined in I/O standards. This BusID has a default value of 0 if an I/O block does not belong to any I/O bus, or has some positive value that corresponds to specified I/O buses. It should be noted that I/O blocks that belong to the same I/O bus and therefore have the same BusID, but have a different range-constraint, would be associated with different I/O standard. A set of I/O blocks that have identical I/O standard may be combined into an I/O group. Because of the addition of a BusID to an I/O standard, the total number of I/O groups will increase and each I/O group will be associated with some I/O bus, where some I/O groups may be of a size 1. The total number of I/O groups created for a given design is defined as $NG=NG_1+NG_2$, where $NG_1$ is the total number of I/O groups formed by single I/O blocks and $NG_2$ is the total number of I/O buses related to groups with BusIDs greater than or equal to 1.

An ILP objective function for determining a placement of I/O blocks may be defined in the form:

$$F=F1+F2. \quad (1)$$

F1 is the proximity optimization objective that attempts to minimize deviation between the ILP solution and the reference solution. Detailed steps to produce a high quality reference solution that takes I/O buses into account will be described by way of example in reference to FIGS. 7 and 8.

$$F1 = \min\left(\sum_{i=1}^{M}\sum_{j=1}^{N_i}\sum_{p=i}^{N}\sum_{q=i}^{N} X_{ijp}D_{pq}R_{ijq}\right), \quad (2)$$

wherein $X_{ijp}$ is a binary variable indicating whether an I/O block j that is assigned to a group i is assigned to a bank p of the programmable IC, $D_{pq}$ is a constant that represents a distance between a bank p and a bank q of the programmable IC, $R_{ijq}$ is a binary variable that indicates whether I/O object j of group i is assigned to bank q in the reference solution, Ni is the size of a set of I/O objects assigned to a group i, M is a total number of groups, and N is a total number of banks on the programmable IC. If the total number of utilized banks is not larger than the total number of available banks N on the target device, the ILP solution will be feasible as no constraints were violated in minimizing the function. According to one embodiment, the cost metric may depend upon distance. The variables $D_{pq}$ may represent pre-computed distances, such as wire length differences or timing differences between a bank p and a bank q on the device, where bank p represents a bank in the placed solution and q represents a bank in the reference solution. In one embodiment, the distance between a set of two banks may be represented by as a Manhattan distance measured from the midpoint of each of the two banks. As is well known, the Manhattan distance reflects the distance between the two points taken at right angles. However, the distances may be measured in any of a variety of ways. The distances may be predetermined for the target device. Accordingly, the inter-bank distances, also referred to as the inter-bank distance matrix, may be re-used for other circuit designs. In any case, since variables $R_{ijq}$, representing the reference solution specifying an assignment of I/O blocks to I/O banks, are known in advance, only one value per bank is 1. The summation of banks q will be restricted to 1 term only since only one of the set $R_{ijq}$ and $X_{ijp}$ may be different from zero. The absolute minimum of the function F will occur when $D_{pq}$ for a given p and q is zero and a feasible ILP solution assigns I/O blocks to the same bank as the reference solution.

F2 is a factor that is used to minimize spreading of I/O buses across I/O banks for a legal ILP solution. According to one aspect of the ILP formulation, additional terms that allow incorporating I/O bus specific information are included in an objective function. These additional terms facilitate a placement of I/O blocks that belong to the same I/O bus in such a way that minimizes the total number of I/O banks occupied by each I/O bus. They also allow using already defined and specified ILP decision variables without introduction of new variables that will increase complexity. Finally, the resulting objective function remains linear in terms of independent variables to preserve ILP applicability.

Bank color assignment variables may be used for I/O group $G_i$ and I/O Bank $B_p$. They define whether at least one I/O block from an I/O group $G_i$ is assigned to an I/O bank $B_p$, and may be equal to 0 or 1. A bank color assignment is designated as $Y_{ip}$ where i=1 . . . M with M representing the number of groups and p=1 . . . N with N representing the number of banks. Bank color assignment variables indicate whether at least one I/O block from a group $G_i$ is assigned to a bank $B_p$. These bank color assignment variables function as utility variables, which may simplify the ILP formulation. Therefore, the new additional term F2 in objective function may be expressed as:

$$F2 = \min\left(\sum_{i=1}^{M2}\sum_{p=1}^{NB} D_{ip}Y_{ip}\right), \quad (3)$$

where $D_{ip}$ is a distance metric described below and where M2 represents the total number of I/O bus groups with a BusID greater than zero and NB is the total number of I/O banks. The objective function F2 defined in equation (3) enables the summation over index i includes I/O bus specific groups only with a BusID greater than 0. Each $Y_{ip}$ variable shows whether any element of I/O Group $G_i$ is assigned to an I/O bank $B_p$. Therefore, the sum over banks in (3) gives a metric of I/O bus spreading to a number of different banks.

The choice of a distance metric is not unique, and there are many different forms of $D_{ip}$ that serve slightly different purposes. The simplest choice for $D_{ip}$ is to keep all of them equal to 1. In this case, the formula (3) gives a total spreading of all I/O groups associated with I/O buses. It can be easily seen that F will be minimal if each individual contribution is minimized because each contribution is a non-negative quantity. While the objective function F2 is used to minimize spreading of I/O buses across I/O banks, this objective function has an absolute minimum if each I/O bus is assigned to one I/O bank only. Another possible choice for $D_{ip}$ may be motivated by desire to assign I/O buses not only to minimal number of I/O banks, but keep these banks close to each other. This objective may be accommodated by selecting some fixed anchor point for each I/O bus. This fixed anchor point may be extracted from optimized reference solution, or postulated according to some other criteria. $D_{ip}$ may be computed as a normalized distance between an I/O bank $B_p$ position and an anchor position for group $G_i$ with a BusID greater than 0. Accordingly, each I/O Bus will occupy a minimal feasible number of I/O banks, but the I/O banks occupied will be close to each other and to the I/O bus specific anchor point.

Figure 7:
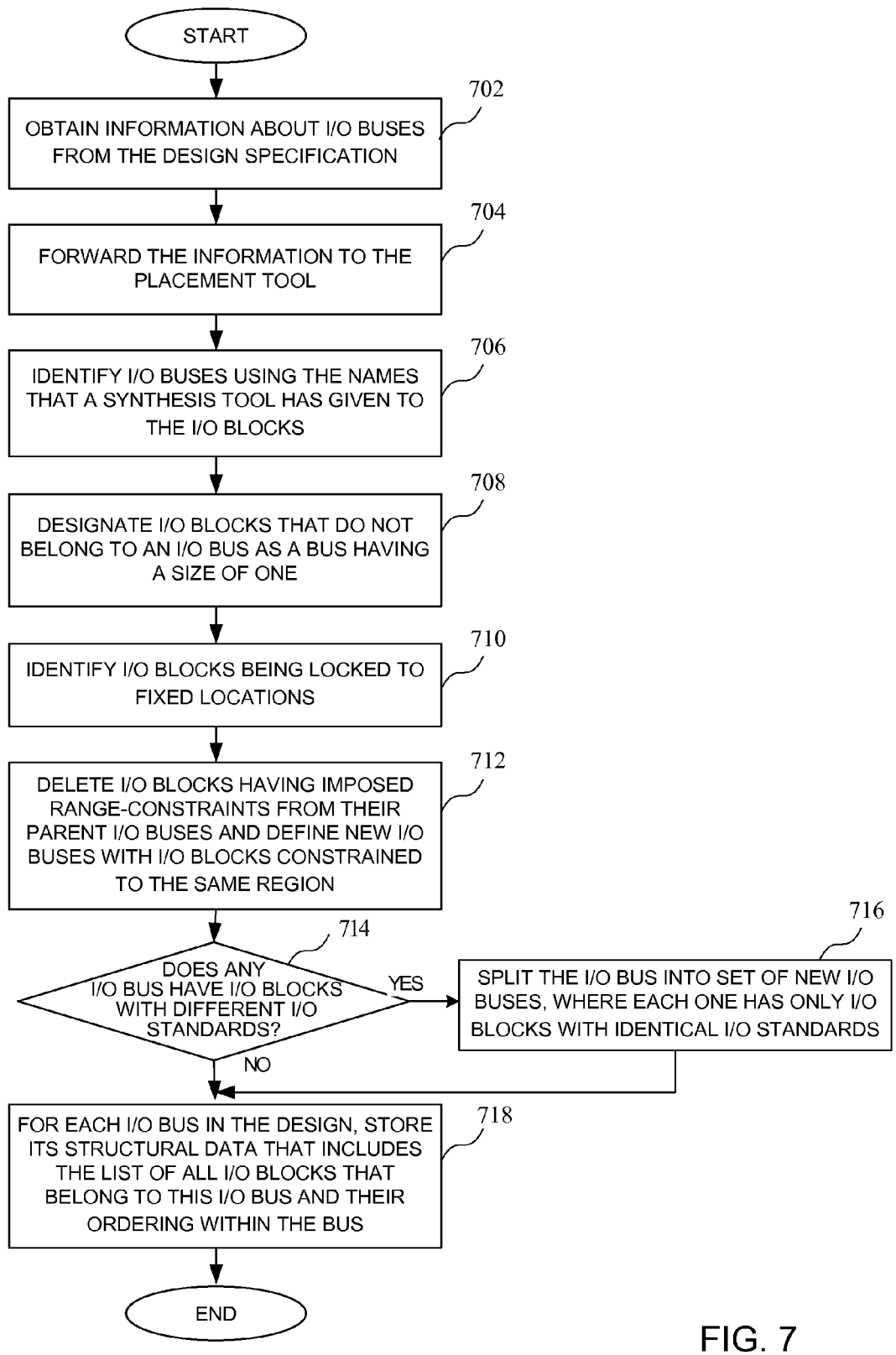
FIG. 7 is a flowchart showing a method of identifying I/O buses at step 606 of FIG. 6 according to an embodiment of the present invention.

Turning now to FIG. 7, a flowchart shows a method of identifying I/O buses at steps 606-610 of FIG. 6 according to an embodiment of the present invention. In particular, information about I/O buses may be obtained from the design specification at a step 702, and the information is forwarded to the placement tool at a step 704. I/O buses are identified using the names that a synthesis tool has given to the I/O blocks at a step 706. I/O blocks that do not belong to I/O buses are considered to be buses of size one at a step 708. I/O blocks being locked to fixed locations are identified at a step 710. I/O blocks having imposed range-constraints are deleted from their parent I/O buses and new I/O buses with I/O blocks constrained to the same region are defined at a step 712. It is then determined whether any I/O bus has I/O blocks with different I/O standards at a step 714. If so, the I/O buses are split into a set of new I/O buses, where each I/O bus has only I/O blocks with identical or compatible I/O standards at a step 716. For each I/O bus in the design, structural data for the I/O buses, including a list of all I/O blocks that belong to an I/O bus and their ordering within the bus, are stored at a step 718.

Figure 8:
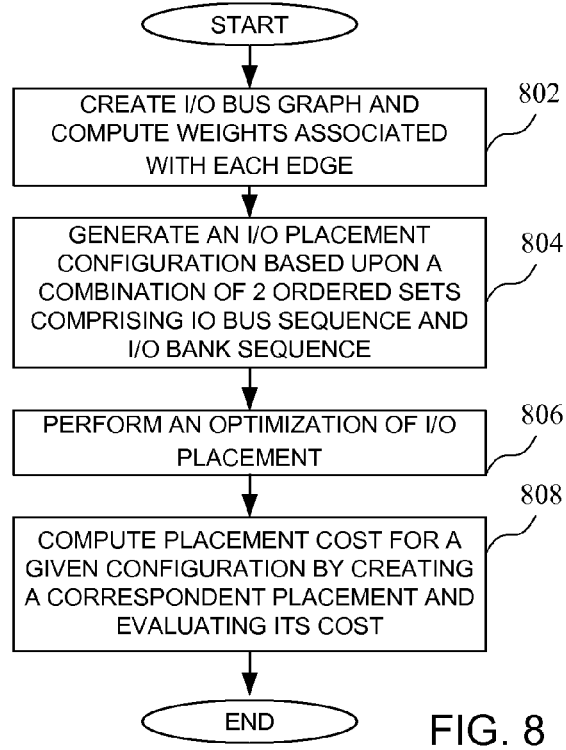
FIG. 8 is a flow chart showing generating a reference solution according to steps 618-620 of FIG. 6 according to an embodiment of the present invention.

Turning now to FIG. 8, a flow chart shows generating a reference solution according to steps 618-620 of FIG. 6 in one embodiment of the present invention. An I/O bus graph is created, and weights associated with each edge are computed at a step 802. That is, the design is modeled as an undirected graph with a set of nodes and a set of edges as shown for example in FIG. 4. In particular, the set of nodes contains a node for each I/O bus, including single block I/O buses. The buses may also include anchor I/O buses with fixed positions on device. Each edge $E_i$ between two nodes has an associated weight W. The weight depends on the number of paths between I/Os in the two I/O buses and the number of logic levels on these paths, and reflects connectivity between correspondent nodes, as will be described in more detail below. The I/O bus graph is created only once and is kept intact during I/O placement.

An I/O placement configuration is generated based upon a combination of two ordered sets comprising an I/O Bus sequence and I/O Bank sequence at a step 804. Each configuration corresponds to some placement solution and has an associated cost that may be used for placement optimization. An I/O bus sequence is formed by enumerating all movable I/O buses (i.e. all nodes in I/O bus graph other than anchor nodes) in the design. Each bus has a set of associated I/O blocks and their ordering in a bus. The I/O Bus sequence is defined as $G=\{G_j\}$, where $G_j$ is an I/O bus and index $j=1, \ldots, M$, where M is the total number of movable I/O buses in the design. The I/O bank sequence is formed by enumerating all I/O banks on the device. Each I/O bank has a set of associated I/O sites Si, where some of them may already be occupied and not available for placement. Each I/O bank sequence has as a result specified ordering of available I/O sites. The I/O Bank sequence is defined as $B=\{B_i\}$, where $B_i$ is an I/O bank and index $i=1, \ldots, NB$, where NB is the total number of I/O banks on device.

An optimization of I/O placement is performed at a step 806. The optimization may be performed by using simulated annealing, which is a general optimization technique that starts from a randomly chosen configuration and iteratively improves correspondent placement solution. Each step of the simulated annealing technique replaces the current solution by a random "nearby" solution, chosen with a probability that depends on the difference between the corresponding function values. As applied to I/O placement, the iterative improvement consists of a perturbation of a current configuration by randomly swapping two buses from an I/O bus sequence or two banks from I/O bank sequence. Each generated configuration has some associated cost that allows optimizing a placement solution by minimizing this cost. Therefore, a computation of placement cost is performed for a given configuration by creating a placement and evaluating its cost at a step 808.

More particularly, an associated cost may be computed according to the following cost function:

$$\text{Cost} = \min(WL + P1 + P2), \quad (4)$$

where WL is the total weighted length of connections between I/O buses. WL includes both movable I/O buses and anchor buses. It should be noted that placement optimization might include trade-off decisions for I/O buses that might be attracted to their connected anchors and to other connected movable I/O buses. The two other contributions, P1 and P2 in equation (4) represent various penalty terms which will be described in more detail below, and are equal to zero when the placement is legal.

Each term in (4) is now described in more detail. The placement solution is defined as the following map between each I/O block $I_i$ and 2-dimensional position $R_i$ with coordinates $(X_i, Y_i)$, where index $i=1, \ldots, N_{io}$, with $N_{io}$ being the total number of I/O blocks in the design. Each I/O block belongs to some I/O bus $G_j$ ($j=1, \ldots, M$) and the total number of I/O blocks in the I/O bus $G_j$ is $N_j$. The total weighted length WL of inter-bus connections is computed as:

$$WL = \sum_{i=1}^{M} \sum_{j=i+1}^{M} \sum_{k=1}^{Ni} \sum_{l=1}^{Nj} W_{klij} D_{kl} \quad (5)$$

where $W_{klij}$ is the weight between I/O blocks ki that belongs to I/O bus $G_i$ and I/O block lj that belongs to I/O bus $G_j$, and $D_{id}$ is the distance between associated positions $(X_{ki}, Y_{ki})$ and $(X_{lj}, Y_{lj})$. Any distance measure for $D_{kl}$, such as the Manhattan distance, may be used. $W_{klij}$ may be extracted directly from an I/O bus graph. It is shown in equation (5) that the larger the weight $W_{klij}$, the shorter the distance $D_{id}$ between associated I/O blocks to give a minimal value of cost WL.

The first penalty term P1 in equation (4) is computed as a penalty associated with an I/O Bus spreading across multiple I/O banks. P1 is different from WL because P1 includes only intra-bus contributions, while WL includes only inter-bus contributions. While P1 may be computed in many ways, P1 may be computed according to one embodiment using the following equation:

$$P1 = \sum_{i=1}^{M} \sum_{l=1}^{Ni} \sum_{m=l+1}^{Ni} D_{lm} \quad (6)$$

where $D_{lm}$ is the distance between positions of I/O Block $R_l$ and I/O Block $R_m$ that belong to the same I/O Bus. The summation in (6) is performed for all non-trivial I/O buses (with Ni>1 where Ni is the number of I/O Blocks in I/O Bus Gi) and both I/O blocks are placed into different I/O banks. While the requirement that all I/O block be placed in different I/O banks is not strictly required, an estimate of equation (6) with all available distances between all pairs of I/O blocks is possible, in which case P1 will never be equal to 0.

The second penalty term P2 in equation (6) is a calculated penalty associated with banking rules violation. For each I/O Site "s" that has a placed I/O block, a penalty Cs that is equal to zero may be associated with the placement if placement is legal according to banking rules. I/O sites that are illegal only locally may be distinguished from I/O sites that are illegal when a different placement changes the legality of other I/O blocks already placed in the same bank. By an appropriate choice of penalties, the most severe violations of banking rules may be penalized more heavily. It is also possible to simplify formulation and keep all Cs equal to constant C. According to one embodiment, the penalty function P2 may be defined as:

$$P2 = \sum_{p=1}^{NB} \sum_{s=1}^{NP} Cs, \qquad (7)$$

where the summation is performed over all banks designated by NB and for all available sites within each bank designated by NP. Only sites with Cs greater than zero, indicating violations, contribute to the P2. If we used the simplest representation of Cs, the penalty function P2 is equal a product of Cs and the number of violations. Each function P1 and P2 may also be multiplied by a constant coefficient to increase or decrease their relative importance for a good placement solution. It should be noted that if P2 is equal to 0, our reference solution is legal and there is no need to perform additional ILP based constructive placement.

According to one embodiment of the invention, a computer program product may be implemented. The computer program may comprise a computer-readable medium comprising computer-readable program code that assigns a plurality of I/O blocks to I/O sites of an integrated circuit device, the computer-readable medium comprising: computer-readable program code that receives a circuit design having a plurality of I/O blocks to be placed at I/O sites of the integrated circuit device; computer-readable program code that modifies, for each I/O block of the circuit design, an I/O standard for the I/O block to include bus information; computer-readable program code that assigns, for each I/O block to be placed, an I/O site for the I/O block; and computer-readable program code that generates an I/O placement for the I/O blocks of the circuit design. Computer code for any other feature or step of a method described above may be implemented as described.

It can therefore be appreciated that the novel and unique method of placing I/O blocks on an integrated circuit device has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of placing input/output blocks in an integrated circuit device, the method comprising:
receiving a circuit design having a plurality of input/output blocks to be placed at input/output sites of the integrated circuit device;
modifying, for each input/output block of the circuit design, an input/output standard for the input/output block to include bus information;
defining input/output buses, wherein each input/output bus comprises input/output blocks having a common bus identification;
identifying an input/output block which is associated with a predetermined location, wherein the input/output block which is associated with a predetermined location is assigned a new input/output standard;
defining new input/output buses based upon the new input/output standard;
assigning, for each input/output block of the circuit design, an input/output site for the input/output block based upon the new input/output buses; and
generating, using a computer, an input/output placement for the input/output blocks of the circuit design.

2. The method of claim 1 wherein modifying an input/output standard for the input/output block to include bus information comprises assigning a bus identification.

3. The method of claim 1 wherein modifying an input/output standard for the input/output block to include bus information comprises providing an order of the input/output blocks for a bus.

4. The method of claim 1 further comprising creating input/output groups based upon modified input/output standards for the plurality of input/output blocks.

5. The method of claim 4 wherein assigning, for each input/output block of the circuit design, an input/output site comprises assigning input/output sites based upon the input/output groups.

6. The method of claim 1 further comprising generating an integer linear programming model for assigning input/output sites based upon the modified input/output standards.

7. The method of claim 1 wherein generating an input/output placement for the input/output blocks of the circuit design comprises generating a legal input/output placement.

8. A method of placing input/output blocks on an integrated circuit device, the method comprising:
receiving a circuit design having a plurality of input/output blocks to be placed at input/output sites of the integrated circuit device;
modifying, for each input/output block of the circuit design, an input/output standard for the input/output block to include bus information;
creating input/output groups based upon the modified input/output standards for the plurality of input/output blocks;
identifying an input/output block which is associated with a predetermined location, wherein the input/output block which is associated with a predetermined location is assigned a new input/output standard;
defining new input/output groups based upon the new input/output standard;
minimizing, for each input/output group, the number of input/output banks having input/output blocks for the input/output group; and
generating, using a computer, an input/output placement for the input/output blocks of the circuit design.

9. The method of claim 8 wherein modifying an input/output standard for the input/output block to include bus information comprises assigning a bus identification.

10. The method of claim 8 wherein modifying an input/output standard for the input/output block to include bus information comprises providing an order of the input/output blocks for the bus.

11. The method of claim 8 further comprising designating an input/output block that does not belong to an input/output bus to an input/output group having a size of one.

12. The method of claim 8 further comprising identifying input/output blocks being locked to fixed locations, wherein creating input/output groups based upon the modified input/output standards for the plurality of input/output blocks comprises creating input/output groups based upon said fixed locations.

13. The method of claim 8 further comprising deleting an input/output block having a range constraint from a current input/output bus and defining a new input/output bus comprising input/output blocks having the same range constants.

14. The method of claim 8 further comprising determining that input/output blocks of an input/output bus have different input/output standards, and splitting the input/output bus into new input/output buses, wherein input/output blocks of a new input/output bus have the same input/output standard.

15. A computer program product comprising:
- a non-transitory computer-readable medium comprising computer-readable program code that assigns a plurality of input/output blocks to input/output sites of an integrated circuit device, the non-transitory computer-readable medium comprising:
- computer-readable program code that receives a circuit design having a plurality of input/output blocks to be placed at input/output sites of the integrated circuit device;
- computer-readable program code that modifies, for each input/output block of the circuit design, an input/output standard for the input/output block to include bus information;
- computer-readable program code that defines input/output buses, wherein each input/output bus comprises input/output blocks having a common bus identification;
- computer-readable program code that identifies an input/output block being associated with a predetermined location, wherein the input/output block which is associated with a predetermined location is assigned a new input/output standard;
- computer-readable program code that defines new input/output buses based upon the new input/output standard;
- computer-readable program code that assigns, for each input/output block of the circuit design, an input/output site for the input/output block based upon the new input/output buses; and
- computer-readable program code that generates an input/output placement for the input/output blocks of the circuit design.

16. The computer program product of claim 15 further comprising computer-readable program code that creates input/output groups based upon the modified input/output standards for the plurality of input/output blocks.

17. The computer program product of claim 15 further comprising computer readable program code that generates an integer linear programming model for assigning input/output sites based upon the modified input/output standards.

18. The computer program product of claim 15 further comprising computer readable program code that identifies input/output blocks being locked to fixed locations, wherein creating input/output groups based upon the modified input/output standards for the plurality of input/output blocks comprises creating input/output blocks based upon the fixed locations.

19. The computer program product of claim 15 further comprising computer readable program code that deletes an input/output block comprising a range constraint from a current input/output bus and defines a new input/output bus having input/output blocks having the same range constraint.

20. The computer program product of claim 15 further comprising computer readable program code that determines that input/output blocks of an input/output bus have different input/output standards, and splits the input/output bus into new input/output buses, wherein input/output blocks of a new input/output bus have the same input/output standard.

* * * * *